United States Patent
Lumeau et al.

(10) Patent No.: US 12,030,333 B2
(45) Date of Patent: Jul. 9, 2024

(54) METHOD FOR VACUUM DEPOSITION OF A COATING ON THE FRONT FACE OF A SUPPORT, SUPPORT AND CORRESPONDING SECURITY DOCUMENT

(71) Applicants: OBERTHUR FIDUCIAIRE SAS, Paris (FR); Centre National de la Recherche Scientifique (CNRS), Paris (FR); ECOLE CENTRALE DE MARSEILLE, Marseilles (FR); Universite D'Aix Marseille, Marseilles (FR)

(72) Inventors: Julien Lumeau, Marseilles (FR); Fabien Lemarchand, Cabries (FR); Antonin Moreau, Marseilles (FR); Thomas Begou, Marseilles (FR); Julien Gillot, Chateaugiron (FR); Xavier Borde, Osse (FR)

(73) Assignees: OBERTHUR FIDUCIAIRE SAS (FR); Centre National de la Recherche Scientifique (CNRS) (FR); ECOLE CENTRALE DE MARSEILLE (FR); Universite D'Aix-Marseille (FR)

(*) Notice: Subject to any disclaimer, the term of this patent is extended or adjusted under 35 U.S.C. 154(b) by 530 days.

(21) Appl. No.: 17/297,138

(22) PCT Filed: Nov. 28, 2019

(86) PCT No.: PCT/EP2019/082927
§ 371 (c)(1),
(2) Date: May 26, 2021

(87) PCT Pub. No.: WO2020/109475
PCT Pub. Date: Jun. 4, 2020

(65) Prior Publication Data
US 2022/0009269 A1   Jan. 13, 2022

(30) Foreign Application Priority Data

Nov. 29, 2018 (FR) .................................. 1872035

(51) Int. Cl.
*B42D 25/373* (2014.01)
*B42D 25/29* (2014.01)
(Continued)

(52) U.S. Cl.
CPC .......... *B42D 25/373* (2014.10); *B42D 25/29* (2014.10); *B42D 25/405* (2014.10);
(Continued)

(58) Field of Classification Search
CPC .... B42D 25/373; B42D 25/29; B42D 25/351; C23C 14/044; C23C 14/04; C23C 14/225; C23C 14/22; C23C 14/542; C23C 14/54
(Continued)

(56) References Cited

U.S. PATENT DOCUMENTS 5,911,858 A   6/1999   Ruffner
6,440,277 B1  8/2002   D'Amato
(Continued)

FOREIGN PATENT DOCUMENTS

WO   0140535 A2   6/2001
WO   0140535 A3   12/2001

OTHER PUBLICATIONS

International Search Report for Application No. PCT/EP2019/082927, dated Feb. 24, 2020, 3 pages.
(Continued)

*Primary Examiner* — Justin V Lewis
(74) *Attorney, Agent, or Firm* — Lerner David LLP

(57) ABSTRACT

The present invention particularly relates to a method for physical vacuum deposition of a coating (R) comprising at least one material (M) on at least a portion of a front face
(Continued)

(10) of a support (1), said at least one material (M) originating from an evaporation source or an atomisation source (2), wherein: —use is made of a support (1), at least a portion of the front face (10) of which is smooth, that is to say, does not have any roughness and/or reliefs and/or recesses; —said vacuum deposition is carried out while varying the thickness distribution of the material (M) on said front face (10), that is, while progressively varying the thickness deposited, from a central region (11) in the direction of at least one lateral region (12) contiguous to the central region (11), without modifying the position of the evaporation source or atomisation source (2) of the material particles (M).

18 Claims, 3 Drawing Sheets

(51) Int. Cl.
    *B42D 25/405*     (2014.01)
    *C23C 14/04*     (2006.01)
    *C23C 14/22*     (2006.01)
    *C23C 14/54*     (2006.01)

(52) U.S. Cl.
    CPC .......... *C23C 14/044* (2013.01); *C23C 14/225* (2013.01); *C23C 14/542* (2013.01)

(58) Field of Classification Search
    USPC ........... 283/67, 72, 84, 94, 95, 98; 106/1.01, 106/1.12, 1.18, 1.22, 1.25
    See application file for complete search history.

(56) References Cited

U.S. PATENT DOCUMENTS

| | | |
|---|---|---|
| 6,863,398 B2 | 3/2005 | Bauer et al. |
| 2005/0040641 A1* | 2/2005 | Cote .................... B42D 25/373 283/72 |
| 2008/0316628 A1 | 12/2008 | Nakajima et al. |
| 2009/0317595 A1 | 12/2009 | Brehm et al. |

OTHER PUBLICATIONS

French Search Report for Application No. FR 1872035, dated Aug. 16, 2019, 2 pages.

\* cited by examiner

FIG. 4
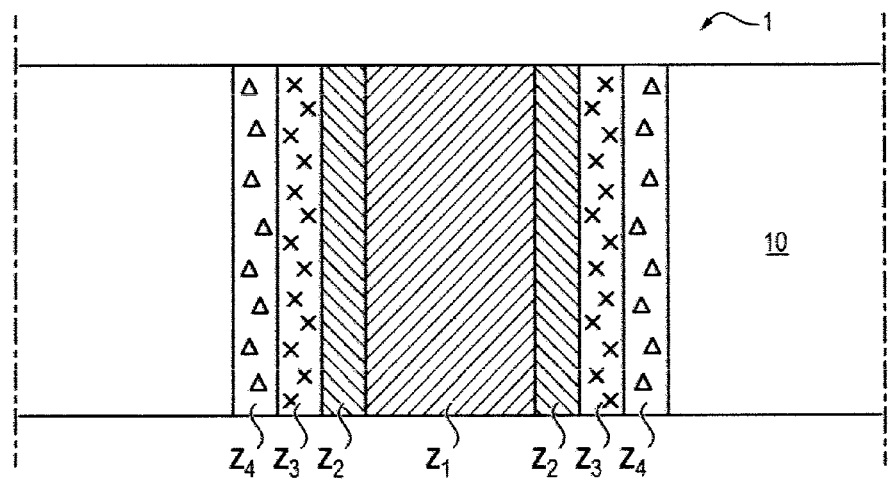
FIG. 5
FIG. 6
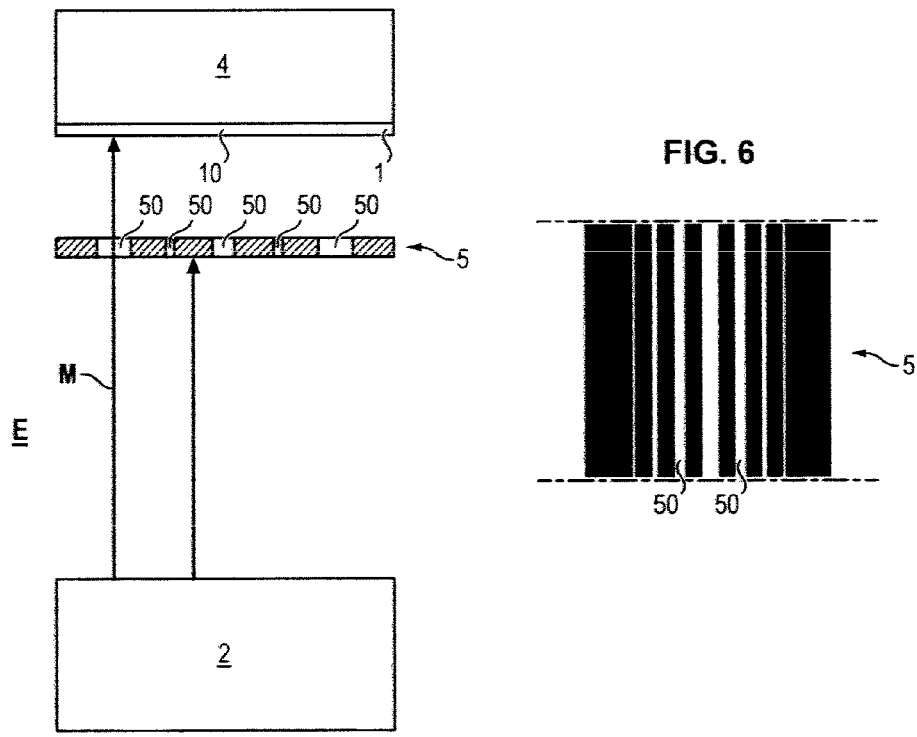

METHOD FOR VACUUM DEPOSITION OF A COATING ON THE FRONT FACE OF A SUPPORT, SUPPORT AND CORRESPONDING SECURITY DOCUMENT

CROSS REFERENCE TO RELATED APPLICATIONS

The present application is a national phase entry under 35 U.S.C. § 371 of International Application No. PCT/EP2019/082927 filed Nov. 28, 2019, published in French, which claims priority from French Patent Application No. 1872035 filed Nov. 29, 2018, all of which are incorporated herein by reference.

FIELD OF THE INVENTION

The present invention relates to a process for physical vacuum deposition of a coating comprising at least one material coming from an evaporation or sputtering source on at least a part of a front face of a support.

It also relates to the support thus obtained and to a security document that includes such a support.

STATE OF THE ART

The security of official and/or valuable printed matter is a major issue, both in the field of personal identification and in the use of banknotes, checks and gift vouchers, tax stickers, labels for luxury items, etc.

Thus, solutions exist and others are developed and proposed regularly with the aim of:
  integrating safety elements that are intuitive to use for everyone;
  making the printed matter more complex in order to make it impossible for fraudsters to reproduce it;
  facilitating the authentication of documents without a tool or with specific tools, even for the general public.

Thus, banknotes are known in which at least one security element with singular optical effects, which change according to the angle from which it is viewed, is inserted. Such is the case of an optical interference filter capable of showing color variations according to the observation angle.

An example of security elements of this type is a support in the form of a transparent plastic film on which regular layers of essentially metallic and/or mineral materials are successively vacuum deposited. This results in a uniform visual effect over the entire surface of the element, for a given direction of observation.

On the other hand, if the thickness of the layers is not regular, the hope is, for a given direction of observation, to obtain several simultaneous visual effects.

The document US 2009/0317595 describes a process for manufacturing a multilayer structure, in particular by vacuum deposition of metallic materials, in order to achieve perfect or almost perfect registration levels between two layers and thus generate remarkable visual effects for observers in the context of securing valuable and official printed matter.

The selective deposition of metal layers using a mask is mentioned without further specifics.

An alternative embodiment is described relating to the progressive thickness variation during the vacuum deposition of metal oxides on an uneven surface, i.e., one that has been deformed beforehand and has a succession of peaks and valleys. The fact of forming a colored layer of variable thickness is mentioned.

Thus, a material deposition under normal incidence on a first region of a replication layer will have a thickness t0, whereas a material deposition on a region with reliefs/hollows on the replication layer will have a thickness t less than t0.

This document thus concludes that the thickness of the material deposition varies with the angle of incidence of the target surface with respect to the horizontal.

But, in practice, if it is easy to carry out depositions on a flat and smooth surface which will lead to homogeneous optical effects of change of colors on broad zones, and if it is also possible to carry out these depositions on a support of uneven or irregular surface with engravings, veins which will give additional particular visual effects localized on these hollows and reliefs, it is on the other hand particularly difficult to obtain optical effects of change of colors of this last type on smooth surfaces.

An additional state of the art is constituted by:
  U.S. Pat. No. 5,911,858 which relates to a technique for deposition of a coating on optical substrates such as mirrors;
  U.S. Pat. No. 6,863,398 which describes a system for coating the surface of optical components such as lenses;
  US-A-2008/316628 relates to a technique for manufacturing filters to adjust the amount of light for an imaging camera.

DISCLOSURE OF THE INVENTION

Thus, the present invention remedies the disadvantages described above. To this end, it proposes a process for physical vacuum deposition of a coating comprising at least one material, on at least a part of a front face of a support, said material coming from an evaporation or sputtering source, according to which the following steps are carried out:
  a) use is made of a support of which at least a part of said front face is smooth, i.e., free of asperities and/or reliefs and/or hollows;
  b) said vacuum deposition is carried out by varying the thickness distribution of the material on said part of said front face, namely by progressively varying the deposited thickness, from a central region toward at least one lateral region contiguous to said central region, without modifying the position of the source of evaporation or sputtering of the material,
  characterized by the fact that said material is selected from the group consisting of metals, metal oxides, dielectric materials, fluorides, sulfides, semiconductors and combinations of at least two thereof and that use is made of a support in the form of a roll web, and that it is successively unwound to expose an unwound section to said deposition on at least a part of said unwound section, wound thereon and so on.

Thus, by progressively varying said thickness, a support with the different and simultaneous visual effects hoped for is obtained. Indeed, this thickness gradient allows a different optical visual effect to be produced depending on whether a zone of high thickness or a zone of lower thickness is observed. Depending on the material distribution produced, it is thus possible to observe either zones with uniform color change, or zones whose colors are sufficiently close to create a mixture of rainbow-type color lines, or a spatial combination of both effects.

An example embodiment thus consists in creating a central zone with uniform color change and peripheral zones whose colors are sufficiently close to create a mixture of rainbow-type color lines. In this case, when the angle of observation is changed, the central zone passes progressively and uniformly from one color to another while the peripheral zones change color from one to the other, thus creating a relative movement effect of the "sliding door" type.

According to other non-limiting and advantageous features of this process:

- an aperture device comprising at least one opening is interposed between said support and said evaporation or sputtering source, at a distance from said flat front face, in such a way that said opening is positioned facing said central region, said source also being situated facing said opening, on the side opposite said support;
- said coating consists of at least two superimposed layers formed of at least two different materials, and for each of the other layers, said vacuum deposition is carried out either in accordance with said step b) or in the form of a layer of uniform thickness both on said central region and on said contiguous region;
- said coating consists of a light-reflecting layer, a dielectric layer and a light-absorbing layer, and said step b) is carried out only for the dielectric layer;
- in step b), the thickness distribution of the material is controlled by varying the angle of impact of the material particles on said front face;
- this support is applied, prior to said deposition, against a convex or concave surface, or a surface having convex and concave zones;
- when dealing with a convex surface, it is made up of at least a part of a cylinder, a cone, a truncated cone, or a sphere;
- when dealing with a concave surface, it is made up of at least a part of a trough or a conical, frustoconical, or spherical-portion shaped cavity;
- in order to control the thickness distribution of said material, said support is positioned in such a way that its front face is flat and said support is made to run relative to said aperture device, either continuously at a constant or non-constant speed, or stepwise;
- the distance between said aperture device and said front face is adjustable and preferably comprised between zero and a few tens of millimeters;
- said aperture device consists of a screen, a mesh, a stencil mask or a multi-aperture element;
- said aperture device is preferably flat;
- said aperture device comprises at least one elongated aperture, the largest dimension of said elongated aperture preferably being oriented in the direction of travel of said material web past said evaporation or spray source;
- said front face and said aperture device are parallel or inclined relative to each other.

The present invention also relates to the support obtained by implementing the process according to any of the preceding features, as well as to a security element which consists of or comprises such a support.

It also relates to a security document, in particular a banknote, characterized by the fact that it comprises on its surface or in its thickness at least one support, respectively at least one support fraction according to the preceding feature.

Finally, the invention also relates to a security document, in particular a banknote, consisting of a substrate of polymeric material, which is formed from the aforementioned support.

DESCRIPTION OF THE FIGURES

Other features and advantages of the invention will become apparent from the following description of a preferred embodiment of the invention. This description is made with reference to the appended drawings in which:

FIG. 4 is an illustration, seen from above, of a support obtained by implementing the principle used in the context of the invention;

FIG. 5 is a schematic diagram showing a possible arrangement for implementing an aperture device in the context of the invention;

FIG. 6 is a partial top view of an example of a mask that can be used in the context of FIG. 5;

DETAILED DESCRIPTION OF THE INVENTION

The figures accompanying the present application are illustrative only, meaning that distances, thicknesses, spacings, etc. do not reflect reality.

Figure 1:
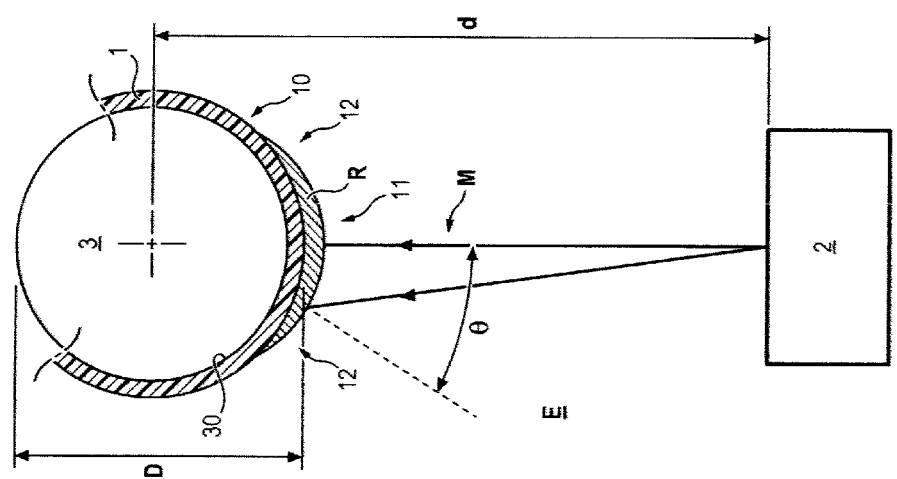
FIG. 1 is a schematic diagram showing an arrangement that can be used to illustrate a principle implemented according to the invention.

As mentioned above, the principle of physical vacuum deposition of a coating makes use of a support 1, visible in particular in FIG. 1, at least a part of whose front surface 10 is smooth, i.e., it is free of any asperities and/or reliefs and/or recesses such as an engraving. By this is meant that the surface, although it has some surface roughness (micro or macroscopic) that could be considered chaotic, has not been intentionally altered to constitute a characteristic relief forming a particular effect, a pattern, or a piece of information intended to be perceived by an observer.

Thus, a material M is vacuum deposited on the front surface 10 of the support 1 by varying its thickness distribution, i.e., by progressively varying the deposited thickness of this material M, from a central region 11 of the front face 10 in the direction of at least one lateral region 12 contiguous to this central region, without, however, modifying the relative position of a source 2 for evaporating or sputtering the material with respect to the support 1.

More particularly, with reference to FIG. 1, a support 1 is used which is preferentially made of a transparent plastic film, such as polyethylene terephthalate or bi-oriented polypropylene. Such supports are already commonly used in banknotes, for example, to support colored or color-variant metallic depositions. Of course, other supports, provided that they are suitable for the treatment mentioned here, are entirely possible.

The support 1 is here placed against a cylinder 3 in such a way that its front face 10, which is free of asperities and/or relief, is opposite the evaporation source 2, i.e., opposite to this cylinder. The cylinder 3 has a diameter D.

The cylinder 3 and the associated support 1 are placed in a vacuum chamber E and are subjected to an evaporation or sputtering source 2 containing a material M. This source 2 is advantageously in the form of a crucible and receives a material which is selected from the group consisting of metals, metal oxides, dielectric materials, fluorides, sulfides, semiconductors and/or combinations of at least two thereof.

The structure of the chamber E and the evaporation/sputtering technique will not be described in greater detail, insofar as they are perfectly conventional and known to the person skilled in the art.

By way of indication, mention may be made of the oxides $SiO_2$, $Ta_2O_5$, $Nb_2O_5$, $ZrO_2$. Other conventional materials already used in optical thin films can be used, such as ZnS or $YF_3$. Other materials are also possible such as metals with a high reflection coefficient in the visible (Al, Ag, Au, Cu, for example).

It is considered here that the distance d which separates the crucible 2 from the axis of the cylinder 3 is very large compared with the diameter D of this cylinder. By way of example, it is considered that the distance d is of the order of 600 mm, whereas the diameter D of the cylinder 3 is a few millimeters to a few tens of millimeters.

Under these conditions, the material that escapes from the crucible 2 due to evaporation/sputtering is emitted in a generally single direction, i.e., at a single angle to the normal of the plate that carries the cylinder 3.

It can then be shown that the distribution of material M deposited on the cylinder 3, and more precisely on the front face 10 of the support 1, varies according to a law proportional to the cosine of the angle of incidence θ on the cylinder 3. A thickness of deposited material is obtained which decreases symmetrically with respect to the distance d to the center of the cylinder 3 of diameter D according to the formula:

$$\text{Amount deposited} \propto \cos(d/\pi D)$$

Thus, it can be seen that, depending on the diameter D of the cylinder 3, it is possible to control the size of the zone with a gradient. Moreover, given the method used to generate this gradient, the effects produced are repeatable and transferable to large-scale production.

Figure 2:
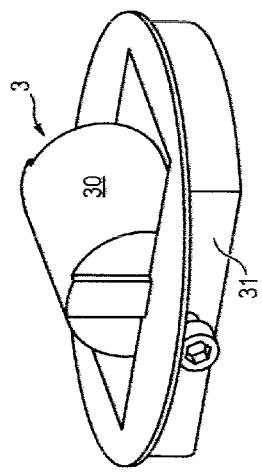
FIG. 2 is a perspective view, along a first direction, of a tool with a convex surface, which can be used in the context of the arrangement of FIG. 1.
Figure 3:
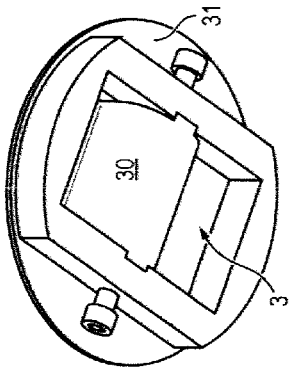
FIG. 3 is a perspective view, along a second direction, of a tool with a convex surface, which can be used in the context of the arrangement of FIG. 1.

For the implementation of the technique just described, use can be made of a cylinder 3 in place on a support 31, as shown in FIGS. 2 and 3, which just leaves toward the interior of the chamber E an exposed surface 30 to which the support 1 is attached. Of course, it is possible to repeat the process just described several times with different materials M, so as to obtain a superposition of coating layers R always distributed according to the process described above. Thus, for example, a support 1 can be obtained on which 100 nm of copper, 270 nm of $SiO_2$, 17 nm of copper, and 400 nm of $SiO_2$ have been successively deposited.

Referring to FIG. 4, the visual effects given by a polyethylene support 1 that has been treated according to the methodology described with reference to FIG. 1 with the above-mentioned thin layers in the case of cylinders 3 with diameters of 15 and 30 mm have been represented.

These optical effects are similar, whether the support 1 is still attached to the cylinder 3 or after it has been detached from the cylinder and laid flat. Thus, in a central part $Z_1$ of the support 1, a uniform green color is observed while the edges generate in the zones $Z_2$, $Z_3$ and $Z_4$ a gradient effect from green to blue, then to violet and yellow, all with a very progressive transition, a fade in the tints. By changing the inclination of the support 1, a "sliding door" effect is observed which is translated by a displacement toward the center of the green-blue limit until the disappearance of the green tint and the appearance of a violet color and quasi uniform. The "sliding door" effect thus obtained, and in particular its amplitude, is directly related to the radius of curvature of the cylinder employed.

Other additional observations can be noted. For example, given the support film exposure geometry used, the color gradient occurs in a single direction that is normal to the axis of the cylinder 3. Along the other direction, parallel to the cylinder axis, the thickness is constant for a given distance from the cylinder center. Furthermore, the "sliding door" effect is clearly visible whatever the size of the cylinders considered. Preferably, a diameter of at least 2 mm is chosen so that the resulting visual effect is easily visible. Moreover, the effect is only visually dynamic when the structure is tilted around the axis of the gradient.

Finally, the same effects, or at least similar effects, are obtained when not a cylinder 3 but any convex or even concave surface is used.

Thus, when dealing with a convex surface, instead of a cylinder, it is possible to use a cone, a truncated cone, a sphere, a torus, etc.

When it is desired to manufacture a coating consisting of several superimposed layers, which is a frequent situation, for each of the other layers, said vacuum deposition is carried out either as described above or in the form of a layer of uniform thickness both on said central region 11 and on said contiguous region 12, provided that the desired optical effect is obtained.

By way of example, when the proposed coating R consists of a light-reflecting layer, a dielectric layer and a light-absorbing layer, the process described above is used only for the dielectric layer, whereas for the other layers a layer of uniform thickness is deposited.

Still in the context of the same methodology, another mode of deposition is described with reference to FIGS. 5 and 6.

Thus, and more particularly with reference to FIG. 5, a support 1 of the same type as the previous one is used and positioned so that its front face 10 is flat.

Advantageously, the support 1 rests on an element 4 on which it is positioned statically or at a controlled speed (continuous, variable or stepwise).

Furthermore, a flat aperture device 5 with at least one opening 50 is positioned between the support 1 and the evaporation/sputtering source 2, this positioning being done at a distance from the flat front face of the support 1 in such a way that the opening 50 is positioned opposite a central region of the front face 10. In this case, a stencil mask in which slits 50 of different widths have been formed beforehand is used as the flat aperture device 5.

Similar to what has been described with reference to FIG. 1, it is understood that the material M passes directly through the openings 50 and impacts the front face 10 of the support 1.

Two cases are then possible: if the aperture device 5 is not in direct contact with the support 1, as is the case in FIG. 5, then the material M scatters a little like light diffracting through a small opening.

In other words, on the front face 10 of the support 1, which runs in the longitudinal direction of the openings 50, depositions of material M will be obtained in zones of great thickness located opposite the openings 50 of the mask 5, this thickness decreasing in their peripheral regions.

In the second case, not shown here, if the aperture device 5 is in direct contact with the support 1 running stepwise with a variable pitch in the running direction, then it is possible to treat the support 1 with controlled and differentiated thicknesses of material M in the direction transverse to the openings 50.

Figure 7:
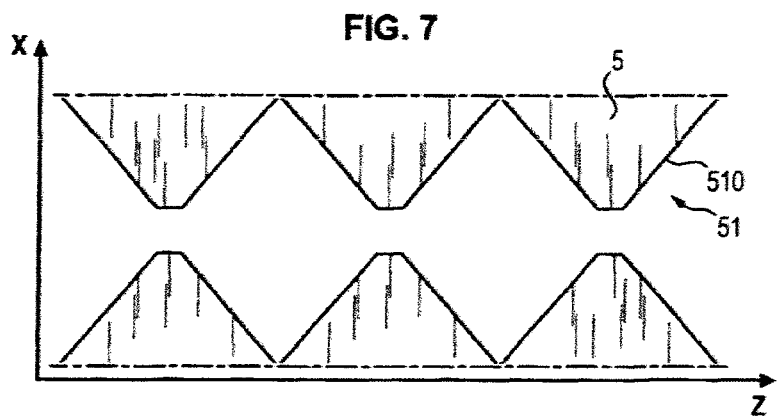
FIG. 7 is a partial top view of a mask with a particular opening profile.

Of course, all possible opening shapes can be imagined for the mask 5. Thus, it can be arranged that the openings 50 have an immediately recognizable shape on the support 1. Thus, with reference to FIG. 7, a mask 5, the opening 51 of which is sinuous along a contour referenced 510, is partially represented.

Of course, any other aperture device 5 can be used. In particular, these include a sieve, a lattice or, more generally, a multi-aperture element.

Figure 8:
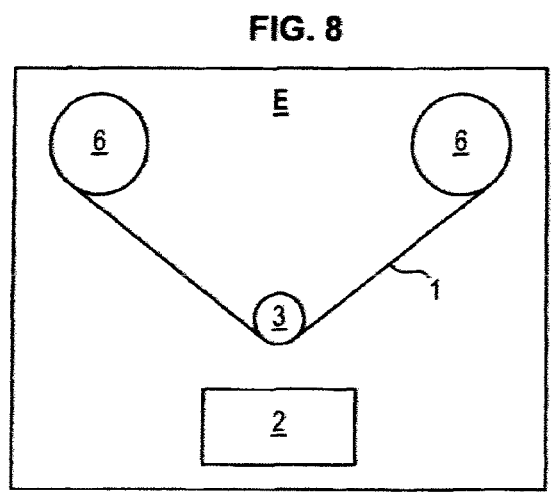
FIG. 8 is a schematic diagram of an installation for implementing a first embodiment of the present invention.
Figure 9:
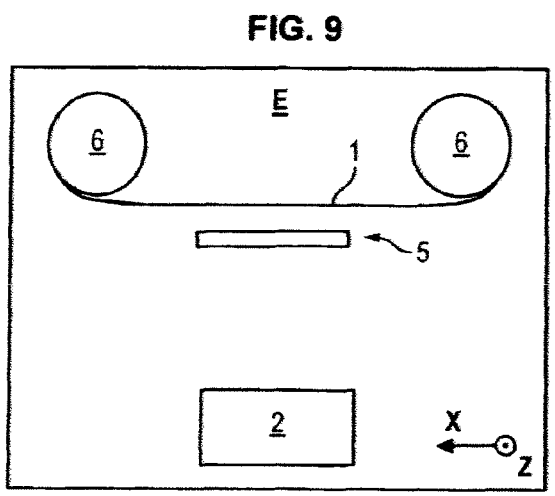
FIG. 9 is a schematic diagram of an installation for implementing another embodiment of the present invention in an industrial phase.

The different alternatives that have just been described are also suitable for industrial production, as shown in FIGS. 8 and 9.

Thus, in the example of FIG. 8, the support 1 is unwound between two cylinders 6, one being a reel or "unwinder" and the other a collector or "rewinder", against a treatment cylinder 3 which is placed opposite a crucible 2. This cylinder 3, which is free to rotate on itself, has an axis parallel to those of the cylinders 6.

The treatment cylinder 3 has an irregular surface and in particular a variable radius along its axis, and the support 1 at least partially follows the surface of the treatment cylinder 3. The support 1 is thus located in the "crosswise" direction, i.e., in the plane of the support perpendicular to the direction of travel, at a variable distance from the source 2. This variation in distance creates a gradient in the thickness of the deposited material in the "crosswise" direction of the support 1.

According to this alternative, the unwinding is preferably carried out at continuous, i.e., constant, speed.

For FIG. 9, the support 1 is unrolled/rolled on two cylinders 6, with an intermediate zone that faces a stencil mask 5.

During this process, the mask 5 is placed at a distance (which can be adjusted as desired) from the support 1 and the source 2.

Advantageously, when the openings 50 of the mask 5 have an elongated shape such as that shown in FIG. 6, it is preferable to position this mask so that the openings 50 are oriented parallel to the direction of travel of the support 1, so as to obtain, at the end of the treatment, a support 1 in which the aforementioned "sliding door" effect is directed transversely (gradient of thickness of the deposited material oriented in the "crosswise" direction of the support 1).

In this case, the speed of the support 1 can be continuous. It can also be differentiated (acceleration/deceleration) or stepwise, so as to obtain a gradient of thickness of the deposited material oriented in the direction of travel of the support 1.

In the context of the invention, an additional means of controlling the depositions may consist of acting closer to the source of emission of the materials, for example by momentarily blocking the flow of the materials in a controlled manner by means of a diaphragm/shutter which acts as a screen, this being valid for all the alternatives described.

In particular, according to an alternative of the embodiment shown in FIG. 9, a diaphragm/shutter 5' replaces the mask 5 so as to expose the support 1 to the deposition of said coating in a discontinuous manner over time. In this way, a thickness gradient of the deposited material is also obtained.

According to an alternative embodiment not shown, a device similar to that shown in FIG. 9 is used without the mask 5. A section of the web constituting the support 1 is exposed to the source 2 to deposit the coating and the unwinding of the support 1 is carried out stepwise or with differentiated speeds (acceleration/deceleration). In this way, different zones (sections) of the support 1 are exposed little by little.

Unwinding stepwise or with differentiated speeds makes it possible to create a thickness gradient in the "running" direction, i.e., in the direction of travel of said material web in front of said source 2.

Finally, the alternatives disclosed here can be combined for more possibilities and flexibility.

Once treated, the support 1 can be cut into different fractions, which are advantageously incorporated into security documents, such as banknotes.

Thus, these fractions, which constitute so many security elements, can be integrated in a window in a value and/or security document, be integrated in the surface of such a document, form a film for closing a window of such a document, etc.

This incorporation, whether it takes place partially on the surface (i.e., in the window), totally on the surface, or in the thickness of the security document, is carried out according to the usual methodologies in the field of paper-making and fiduciary printing.

Said security and/or value document is preferably a banknote.

In the particular case of banknotes whose substrate is made of a polymeric material, it can be envisaged to use, as a substrate, a support 1 obtained in accordance with the process according to the invention.

The invention claimed is:

1. A process for physical vacuum deposition of a coating comprising at least one material, on at least a part of a front face of a support according to a thickness gradient which results in a different visual effect depending on whether a coating zone of high thickness or low thickness is observed, said material coming from an evaporation or sputtering source-, a process according to which the following steps are carried out:
   a) use is made of a support of which at least a part of said front face is smooth, i.e., free of asperities and/or reliefs and/or hollows;
   b) said vacuum deposition is carried out by varying a thickness distribution of the material on said part of said front face, namely by progressively varying a deposited thickness, from a central region of said front face toward at least one lateral region of said front face contiguous to said central region, without modifying a position of the evaporation or sputtering source of the material
   wherein:
   said material is selected from the group consisting of metals, metal oxides, dielectric materials, fluorides, sulfides, semiconductors and combinations of at least two thereof;
   use is made of a support in a shape of a roll web;
   said roll web is successively unwound to expose an unwound section to said deposition on at least a part of said unwound section, and then wound.

2. The process as claimed in claim 1, wherein an aperture device comprising at least one opening is interposed between said support and said evaporation or sputtering source, at a distance from said front face, in such a way that said opening is positioned facing said central region, said source also being located facing said opening, on a side opposite to said support.

3. The process as claimed in claim 2, wherein the distance between said aperture device and said front face is adjustable.

4. The process as claimed in claim 1, wherein said coating consists of at least two superimposed layers formed of at least two different materials, and wherein for each of the other layers beyond the first one, said vacuum deposition is carried out either in accordance with said step b), or in a shape of a layer of uniform thickness both on said central region and on said lateral region.

5. The process as claimed in claim 4 wherein said coating consists of a light-reflecting layer, a dielectric layer and a light-absorbing layer, and wherein said step b) is carried out only for the dielectric layer.

6. The process as claimed in claim 1, wherein, in step b), the thickness distribution of the material is controlled by varying an angle of impact of material particles on said front face.

7. The process as claimed in claim 1, wherein said support is applied, prior to said deposition, against a convex or concave surface, or a surface having convex and concave zones.

8. The process as claimed in claim 7, wherein, when dealing with a convex surface, the convex surface is constituted by at least a part of a cylinder, a cone, a truncated cone, or a sphere.

9. The process as claimed in claim 7, wherein, when dealing with a concave surface, the concave surface is constituted by at least a part of a trough or a conical, frustoconical or spherical portion-shaped cavity.

10. The process as claimed in claim 1, wherein, said support is positioned in such a way that its front face is flat and said support is moved relative to said aperture device, either continuously at a constant or non-constant speed, or stepwise.

11. The process as claimed in claim 1, wherein said aperture device consists of a screen, a mesh, a stencil mask or a multi-aperture element.

12. The process as claimed in claim 1, wherein said front face and said aperture device are parallel or inclined with respect to each other.

13. A support obtained by carrying out the process as claimed in claim 1.

14. A security element, which consists of or comprises a support as claimed in claim 13.

15. A security document, which comprises on a surface thereof or in a thickness thereof at least one support or a fraction of the support as claimed in claim 13.

16. A security document according to claim 15, which consists of a bank note.

17. A security document which consists of a substrate of polymeric material, wherein said the substrate is formed of the support as claimed in claim 13.

18. A security document according to claim 17, which consists of a bank note.

* * * * *